(12) United States Patent  (10) Patent No.: US 7,649,373 B2
Tokunaga  (45) Date of Patent: Jan. 19, 2010

(54) SEMICONDUCTOR INTEGRATED CIRCUIT WITH VOLTAGE DROP DETECTOR

(75) Inventor: Yasuhiro Tokunaga, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 172 days.

(21) Appl. No.: 11/878,034

(22) Filed: Jul. 20, 2007

(65) Prior Publication Data

US 2008/0068045 A1 Mar. 20, 2008

(30) Foreign Application Priority Data

Sep. 15, 2006 (JP) ............................. 2006-251230

(51) Int. Cl.
*G01R 31/26* (2006.01)
(52) U.S. Cl. .................. 324/763; 324/765; 324/769
(58) Field of Classification Search .................. None
See application file for complete search history.

(56) References Cited

U.S. PATENT DOCUMENTS

| 6,836,147 | B2 * | 12/2004 | Nakaya ..................... 326/39 |
| 6,933,729 | B2 * | 8/2005 | Corr ........................... 324/537 |
| 7,339,411 | B2 | 3/2008 | Yuuki et al. |
| 2003/0208727 | A1 * | 11/2003 | Mortensen ................. 716/4 |

FOREIGN PATENT DOCUMENTS

| JP | 5183436 A | 7/1993 |
| JP | 11-008552 | 1/1999 |
| JP | 2001-332699 | 11/2001 |
| JP | 2002222919 A | 8/2002 |
| JP | 2004235576 A | 8/2004 |
| JP | 2006119777 A | 5/2006 |

OTHER PUBLICATIONS

CMOS cho-LSI no sekkei (Design of CMOS VLSI circuits), T. Iizuka, Baifukan, Apr. 1989, pp. 226-227.
Japanese Patent Application No. 2006-251230, mailed Mar. 17, 2009—"Notice of Reason for Rejection" (Partial Translation).

* cited by examiner

*Primary Examiner*—Minh N Tang
(74) *Attorney, Agent, or Firm*—Studebaker & Brackett PC; Donald R. Studebaker

(57) ABSTRACT

A semiconductor integrated circuit includes one or more voltage drop detection circuits located at one or more measurement points within the integrated circuit to detect drops in the power supply potential at those points. The voltage drop detection circuits output signals indicating whether the power supply potential is within tolerance, or whether the power supply potential has fallen and corrective action is required. Being located near the measurement points, the voltage drop detection circuits can measure the power supply potential without being disturbed by electrical noise elsewhere in the semiconductor integrated circuit. The signals output by the voltage detection circuits can be reliably brought to external terminals despite the presence of such noise, because the output signals are bi-level signals.

5 Claims, 6 Drawing Sheets

… (US 7,649,373 B2)

SEMICONDUCTOR INTEGRATED CIRCUIT WITH VOLTAGE DROP DETECTOR

BACKGROUND OF THE INVENTION

1. Field of the Invention

The present invention relates to a semiconductor integrated circuit, more particularly to the detection of power supply voltage drops in a semiconductor integrated circuit.

2. Description of the Related Art

As semiconductor integrated circuits become ever more densely integrated, the width of their internal power supply lines is reduced, and the resulting increased resistance impedes the supply of power to their internal circuitry. To compound this problem, semiconductor integrated circuits comprise increasingly large numbers of transistors operating at increasingly high speeds, therefore drawing increasing amounts of current, which must be fed through the increased resistance of the power supply lines. This combination of current and resistance can produce significant voltage drops on the power supply lines, and these voltage drops can lead to various types of circuit malfunctions.

A known method of dealing with this problem without sacrificing integration density or operating speed is to monitor the power supply voltage at strategic points within the integrated circuit and take corrective action if a voltage drop is detected. Corrective action might include, for example, boosting the supply voltage, or reducing the clock speed or making other timing adjustments that enable the semiconductor integrated circuit to operate correctly despite the power supply voltage drop.

Japanese Patent Application Publication (JP) No. 2001-332699 places voltage detection cells at specified positions on the power lines of a semiconductor integrated circuit and provides a voltage drop detection circuit that detects voltage drops at these positions. A voltage detection cell is a cell consisting only of a stub leading from the power line to a detection pad. The detection pad is connected by a wiring line to the voltage drop detection circuit, which uses the input voltage received via the wiring line to delay a reference clock signal by a variable amount. A flip-flop clocked by the reference clock signal receives the delayed clock signal as input data and outputs a signal that is high when the delay is small and low when the delay is large. The signal output from the flip-flop is supplied to an external power source to indicate whether or not it is necessary to adjust the power supply voltage.

This voltage drop detection circuit depends on the production of an accurate delay in response to the input voltage. JP 11-8552 describes a slew rate limiter that can produce an accurate delay by supplying the reference clock signal to an inverter connected in series between a pair of current sources controlled by the input voltage, and supplying the output of the inverter to a buffer circuit.

A problem with the semiconductor integrated circuit described in JP 2001-332699 is that the wiring line may be fairly long, because the voltage drop detection circuit is located near a bonding pad at the periphery of the integrated circuit while the voltage detection cell may be located deep in the interior of the integrated circuit. The wiring line therefore has substantial parasitic resistance and capacitance and tends to pick up considerable electrical noise from other parts of the semiconductor integrated circuit en route to the voltage drop detection circuit. These effects make it difficult to detect fluctuations in the power supply voltage accurately, even if the slew-rate limiter described in JP 11-8552 is employed.

SUMMARY OF THE INVENTION

An object of the present invention is to provide a semiconductor integrated circuit that can accurately detect internal drops in its power supply potential.

The invention is a semiconductor integrated circuit comprising at least one functional block having a voltage drop detection circuit for detecting a supply voltage drop within the functional block and outputting a signal indicating presence or absence of the voltage drop.

Since the voltage drop is detected within the functional block in which it occurs, the detection process is not affected by parasitic effects and electrical noise. The output signal produced by the detection process only indicates the presence or absence of the voltage drop, so the output signal is a bi-level signal that can be reliably carried to the periphery of the semiconductor integrated circuit despite the presence of parasitic effects and noise.

Examples of relevant functional blocks include register banks, adders, bit shifters, and other functional blocks comprising a large number of basic units that draw power from a common power supply line.

DETAILED DESCRIPTION OF THE INVENTION

Figure 1:
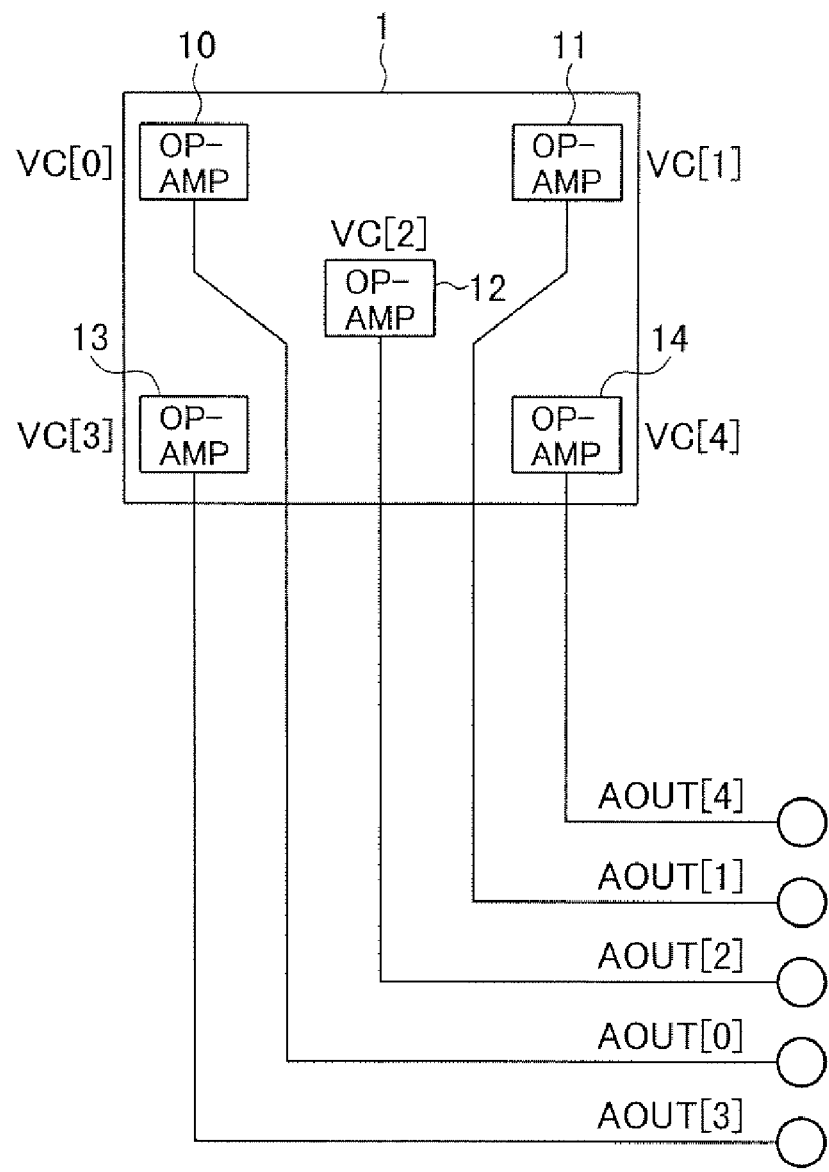
FIG. 1 illustrates a semiconductor integrated circuit according to a first embodiment of the invention.

Embodiments of the invention will now be described with reference to the attached drawings, in which like elements are indicated by like reference characters.

First Embodiment

Referring to FIG. 1, the first embodiment of the invention is a semiconductor integrated circuit formed on a semiconductor chip 1 comprising a single functional block. Operational amplifiers (OP-AMPs) 10, 11, 12, 13, 14 are disposed at five voltage measurement points to detect power supply voltage drops at these points. The power supply voltages measured at the five voltage measurement points are denoted VC[0], VC[1], VC[2], VC[3], VC[4]. The output terminals of the operational amplifiers 10, 11, 12, 13, 14 are connected to external terminals AOUT[0], AOUT[1], AOUT[2], AOUT[3], AOUT[4] such as terminals of a package (not shown) containing the semiconductor chip 1.

Figure 2:
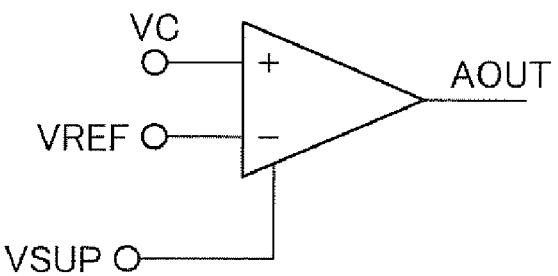
FIG. 2 illustrates an operational amplifier.

Each of the operational amplifiers 10, 11, 12, 13, 14 has three signal input terminals and one signal output terminal as shown in FIG. 2. The voltage to be measured VC is applied to the non-inverting signal input terminal (+). A reference potential VREF slightly less than the nominal power supply voltage VDD is input to the inverting signal input terminal (−). A sensitivity adjustment voltage VSUP is applied to the third input terminal. At its output terminal, the operational amplifier produces a signal AOUT responsive to the difference between VC and VREF. In operational amplifier 10 in FIG. 1, for example, the non-inverting input terminal (+) is connected to measurement point VC[0] and the output terminal is connected to the AOUT[0] terminal.

The difference α between the reference voltage VREF and the nominal power supply voltage VDD (VREF=VDD−α) corresponds to the low-side tolerance of the power supply voltage VDD at the point at which VDD is measured.

Figure 3:
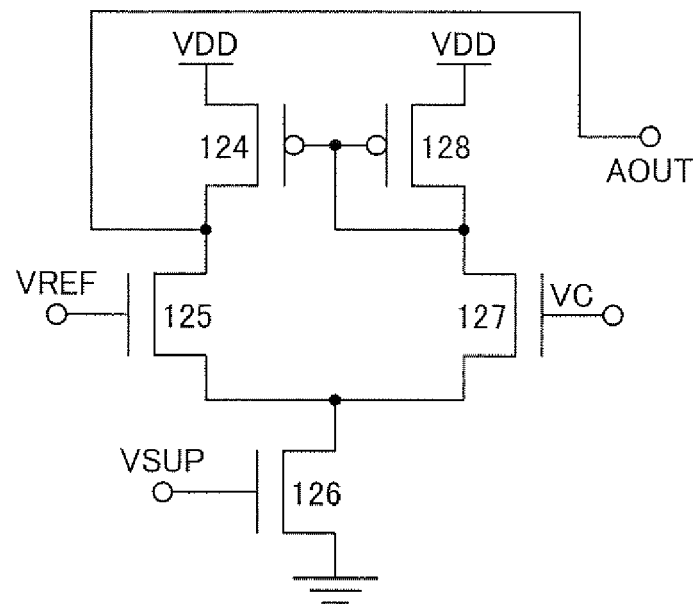
FIG. 3 shows the internal circuit configuration of the operational amplifier in FIG. 2.

The circuit configuration of the operational amplifiers 10, 11, 12, 13, 14 is shown in FIG. 3. Each operational amplifier comprises a pair of p-channel metal-oxide-semiconductor (PMOS) transistors 124, 128 having source, gate, and drain terminals. The sources of both PMOS transistors 124, 128 receive the power supply voltage VDD. The drain of PMOS transistor 124 is connected to the drain of an n-channel metal-oxide-semiconductor (NMOS) transistor 125. The drain of PMOS transistor 128 and the gates of both PMOS transistors 124, 128 are connected to the drain of another NMOS transistor 127. The sources of NMOS transistors 125 and 127 are connected to the drain of yet another NMOS transistor 126. The source of NMOS transistor 126 is connected to ground.

The reference voltage VREF is applied to the gate of NMOS transistor 125. The gain adjustment signal VSUP is applied to the gate of NMOS transistor 126. The voltage VC to be measured is applied to the gate of NMOS transistor 127. The output signal AOUT is taken from the interconnected drains of PMOS transistor 124 and NMOS transistor 125.

The circuit shown in FIG. 3 operates as a differential amplifier. NMOS transistor 126 functions as a current source. If the voltage VC to be measured is equal to the reference voltage VREF, the gate potential of the PMOS transistors 124, 128 is close to their threshold potential. If VC is higher than VREF, the consequent increased conductance of NMOS transistor 127 pulls down the gate potential of the PMOS transistors 124, 128 and shifts current from PMOS transistor 124 to PMOS transistor 127. These factors combine to reduce the voltage drop in PMOS transistor 124 to substantially zero, so the output signal AOUT goes to substantially the VDD level. If VC is lower than VREF, then the gate potential of the PMOS transistors 124, 128 is pulled up while current is shifted from PMOS transistor 127 to PMOS transistor 124, and the output signal AOUT goes to substantially the ground level. Accordingly, the output signal AOUT is essentially a bi-level signal that goes high when the measured voltage VC is above the reference voltage VREF, indicating that the power supply voltage is within tolerance at the measured point, and goes low when the measured voltage VC is below the reference voltage VREF, indicating that the power supply voltage has dropped below its lower tolerance level.

The output signals AOUT[0] to AOUT[4] in FIG. 1 are supplied to a circuit (not shown) that controls the speed of the clock signal supplied to the semiconductor integrated circuit. When all of the output signals AOUT[0] to AOUT[4] are high, the semiconductor integrated circuit operates at its normal clock speed. When one or more of the output signals AOUT[0] to AOUT[4] goes low, the clock speed is reduced appropriately, and the semiconductor integrated circuit continues to operate at the slower clock speed without malfunctioning, despite the below-tolerance power supply voltage.

The operational amplifiers 10, 11, 12, 13, 14 are disposed close to their respective voltage measurement points, so they are able to make accurate comparisons between the voltage to be measured with the reference voltage; the comparisons are not skewed by parasitic effects or disrupted by noise. Moreover, because Since the output signals of the operational amplifiers 10, 11, 12, 13, 14 are essentially bi-level signals, they can be reliably transmitted to the output terminals AOUT[0] to AOUT[4] without reversal of their on or off status (their high or low logic level) despite parasitic effects and noise encountered en route. Accordingly, the operational amplifiers are able to determine reliably whether the power supply voltage is within tolerance or below tolerance, and to report this information reliably to the circuit that controls the clock speed.

The semiconductor integrated circuit therefore operates at a reduced clock speed whenever an internal drop in its power supply potential makes this necessary, but does not operate at a reduced clock speed unnecessarily when the internal power supply potentials are all within tolerance.

Second Embodiment

Figure 4:
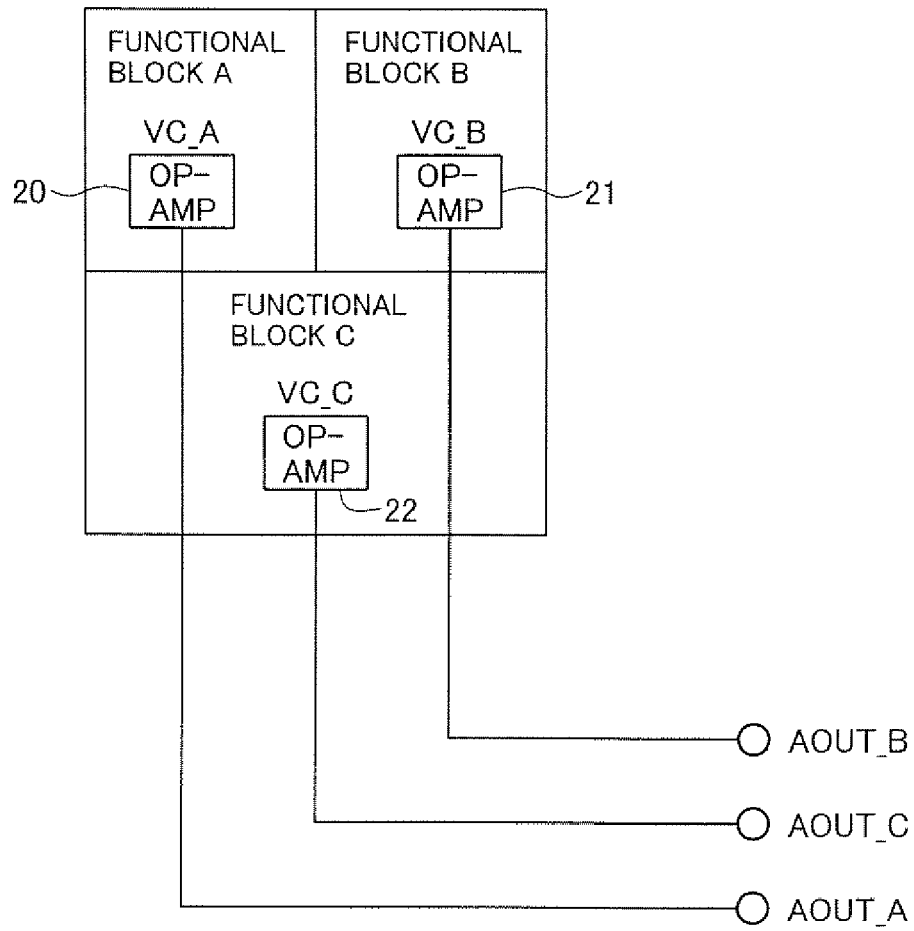
FIG. 4 illustrates a semiconductor integrated circuit according to a second embodiment of the invention.

Referring to FIG. 4, the semiconductor integrated circuit in the second embodiment is formed on a semiconductor chip 1 and comprises three functional blocks A, B, and C, each of which may be active or inactive at any given time. 'Active' means that the functional block is receiving a clock signal and performing operations. 'Inactive' means that the functional block is not receiving a clock signal and is idle. Activity of the different functional blocks is controlled independently by respective block enable signals BLK_EN_A, BLK_EN_B, BLK_EN_C, which are driven high to activate and low to deactivate the corresponding functional blocks.

Functional blocks A, B, C include respective operational amplifiers 20, 21, 22 that measure respective power supply potentials VC_A, VC_B, VC_C at voltage measurement points within the functional blocks.

Figure 5:
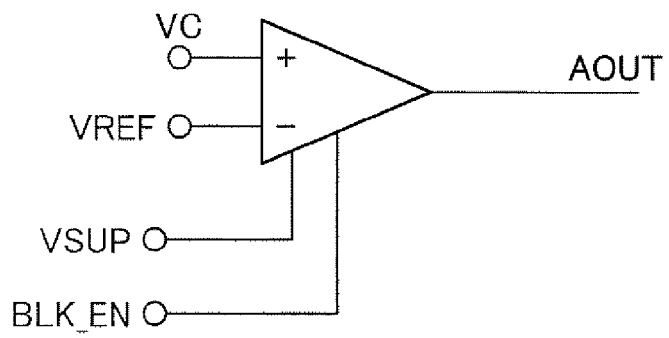
FIG. 5 illustrates another operational amplifier.

Each of the operational amplifiers 20, 21, 22 in the second embodiment has four signal input terminals and one signal output terminal as shown in FIG. 5. In addition to the input and output terminals shown in FIG. 2 in the first embodiment, there is an input terminal for the block enable signal (denoted BLK_EN) of the corresponding functional block.

Figure 6:
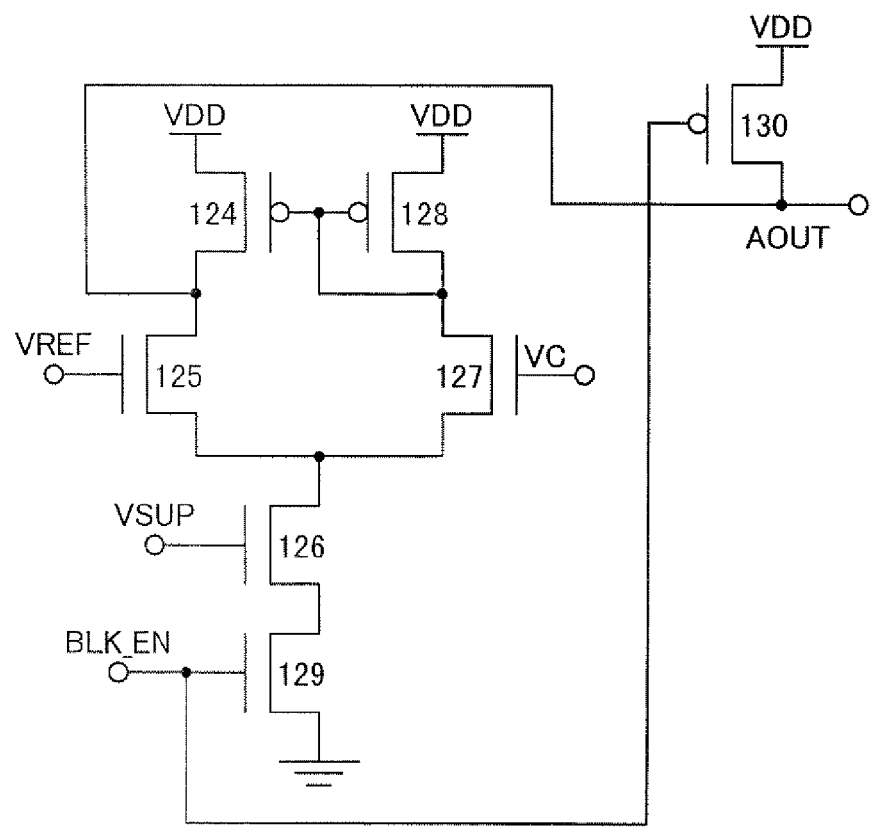
FIG. 6 shows the internal circuit configuration of the operational amplifier in FIG. 5.

Referring to FIG. 6, the operational amplifier circuit configuration in the second embodiment adds another NMOS transistor 129 and another PMOS transistor 130 to the circuit configuration in FIG. 3 in the first embodiment. The gate terminals of both additional transistors 129, 130 are connected to the added input terminal and receive the block enable signal BLK_EN. NMOS transistor 129 is inserted in series between the source terminal of NMOS transistor 126 and ground; the source of NMOS transistor 129 is connected to ground and its drain is connected to the source of NMOS transistor 126. PMOS transistor 130 has its source connected to the power supply VDD and its drain connected to the output terminal of the operational amplifier.

When the block enable signal BLK_EN is high, NMOS transistor 129 is switched on and PMOS transistor 130 is switched off, and the operational amplifier in FIG. 6 operates in the same way as the operational amplifier in FIG. 3, as described in the first embodiment.

When the block enable signal BLK_EN is low, NMOS transistor 129 is switched off and PMOS transistor 130 is switched on, so no current flows through transistors 124-129, voltage detection is disabled, and the output terminal AOUT is pulled up to the high logic level (VDD).

Accordingly, when functional block A, for example, is inactive, the signal output by operational amplifier 20 at external terminal AOUT_A is high, indicating a normal power supply voltage. The signal output by operational amplifier 20 is also high when functional block A is active, provided the measured power supply voltage VC_A is normal. If functional block A is active and its power supply potential VC_A drops below tolerance (below the reference level VREF), however, the signal at external terminal AOUT_A goes low.

Similarly, the signal at external terminal AOUT_B goes low when functional block B is active and is receiving a sub-tolerance power supply potential, and is high at other times; the signal at external terminal AOUT_C goes low when functional block C is active and is receiving a sub-tolerance power supply potential, and is high at other times.

Although the invention is not restricted to any particular types of functional blocks, three typical examples of functional blocks will be described below: a bit shifter, a register bank, and an adder. The descriptions will be brief to avoid obscuring the invention with irrelevant detail.

Figure 7:
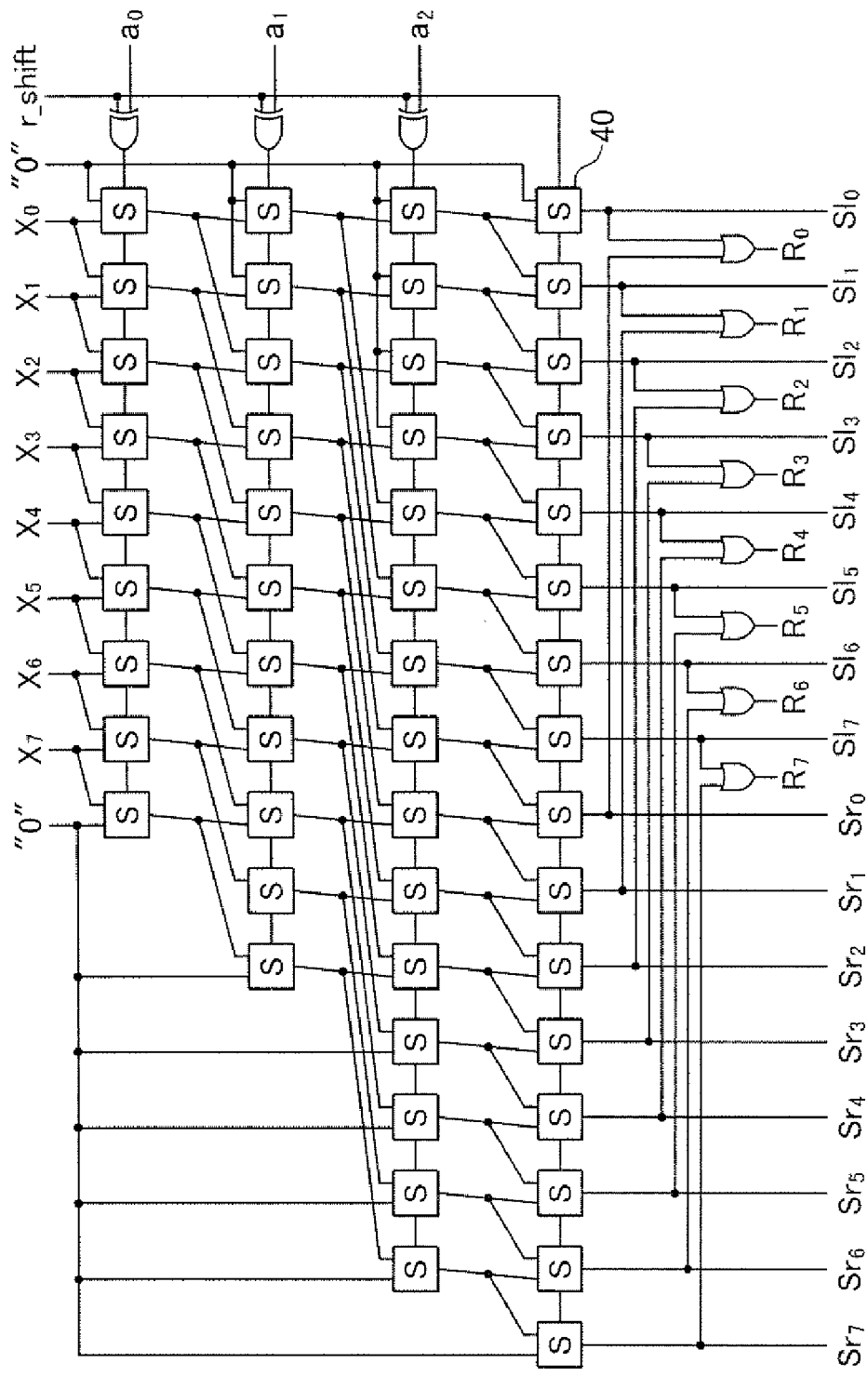
FIG. 7 illustrates the schematic configuration of a bit shifter.

Referring to FIG. 7, the bit shifter receives an eight-bit input signal comprising bits $X_0$ to $X_7$, three control signals $a_0$, $a_1$, $a_2$ that control the width of the shift, and a right-shift signal (r_shift) that controls the direction of the shift (right or left). The bit shifter outputs eight-bit right-shifted data $Sr_0$ to $Sr_7$, eight-bit left-shifted data $Sl_0$ to $Sl_7$, and eight-bit rotated data $R_0$ to $R_7$. The circuit comprises three exclusive-OR gates, eight OR gates, and forty-one selectors (S) 40, all of which are powered from the same power and ground lines. Because of the large number of gates and selectors drawing power from the same source, this functional block has a comparatively small supply voltage margin; even a fairly slight power supply voltage drop is apt to lead to logic malfunctions and produce incorrect results.

Figure 8:
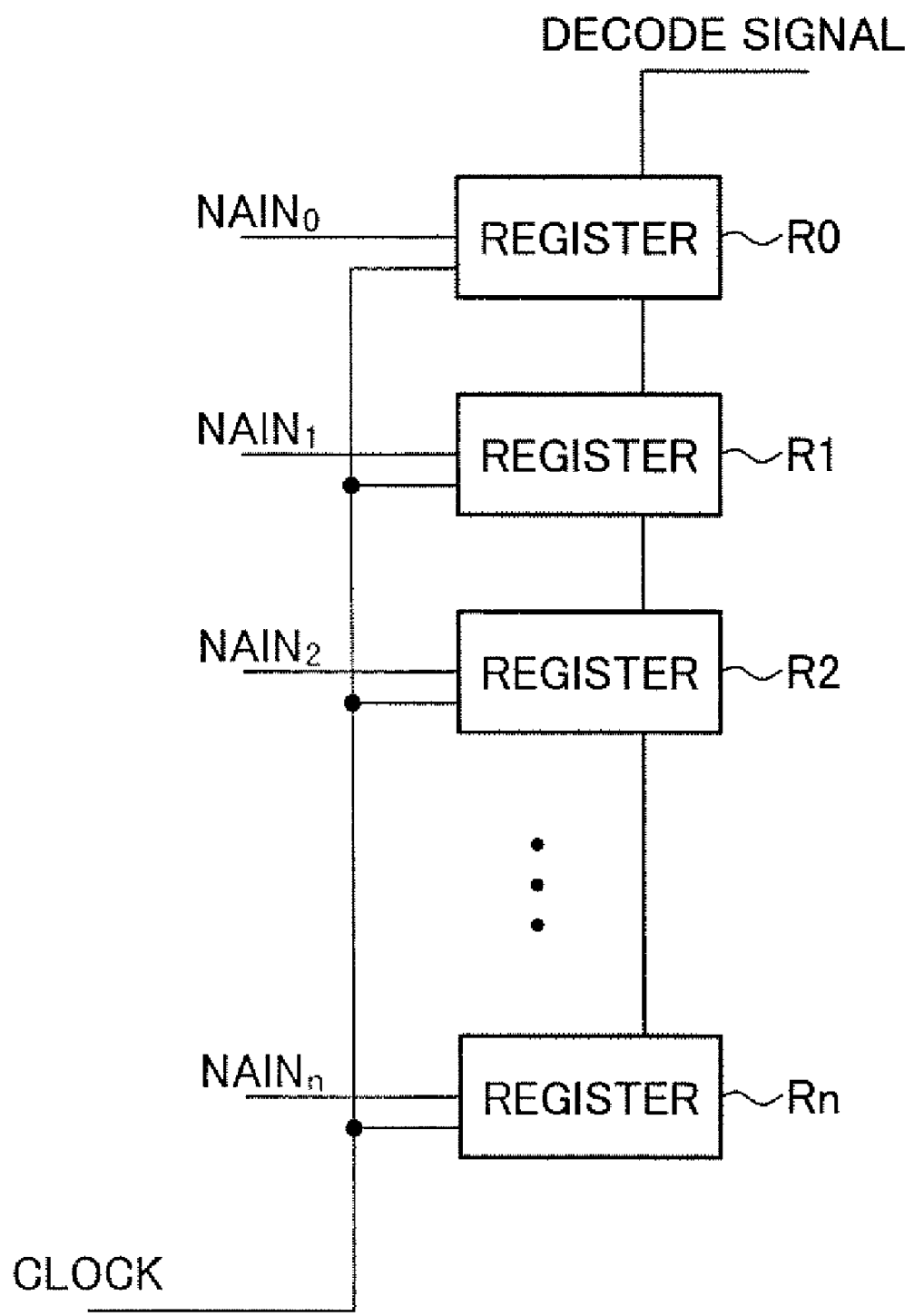
FIG. 8 illustrates the schematic configuration of a register bank.

Referring to FIG. 8, the register bank comprises a plurality of registers R0 to Rn, where n is a positive integer, that receive respective input signals $NAIN_0$ to $NAIN_n$ and are controlled by a clock signal and a decode signal. Data are stored in the registers according to the input signals in synchronization with the clock signal; individual registers are selected by the decode signal. Once again, a large number (n) of circuits (the registers) draw power from a common source, and are apt to operate incorrectly if the power supply voltage drops.

Figure 9:
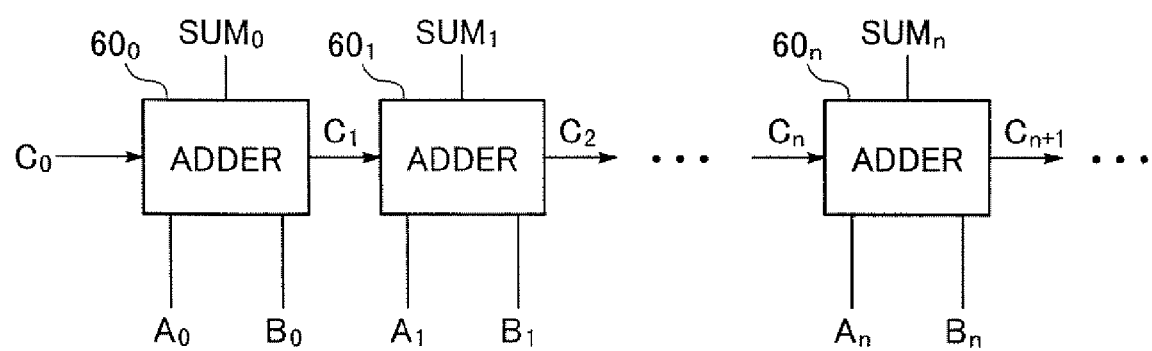
FIG. 9 illustrates the schematic configuration of an adder block.

Referring to FIG. 9, the adder functional block comprises a series of full one-bit adders $60_0$, $60_1$, ..., $60_n$. The i-th one-bit adder receives a pair of one-bit addend signals $A_i$, $B_i$ and a carry signal $C_i$ and outputs a sum signal $SUM_i$ and a carry signal $C_{i+1}$, where i is an integer from 0 to n. Each one-bit adder comprises several logic gates and all of the adders are powered from a common source, so if n is large, even a comparatively small drop in the power supply potential is apt to lead to incorrect operation.

Referring again to FIG. 4, the second embodiment operates as follows.

Suppose, for example, that functional blocks A and C are active and functional block B is inactive. Block enable signals BLK_EN_A and BLK_EN_C are therefore high, and BLK_EN_B is low. The operational amplifiers 20, 22 in functional blocks A and C are enabled and detect whether the power supply voltages being supplied to these blocks are above the reference voltage level or not. The operational amplifier 21 in functional block B is disabled and does not draw current (because NMOS transistor 129 is switched off). The output signal of this operational amplifier 21 is held at the high level.

External terminals AOUT_A, AOUT_B, and AOUT_C are connected to circuits (not shown) that selectively adjust the voltages supplied to functional blocks A, B, and C, or selectively adjust the speed of the clock signals supplied to these blocks or make other timing adjustments. If the signal from operational amplifier 20 or 22 to terminal AOUT_A or AOUT_C goes low, indicating a sub-tolerance power supply potential, these circuits intervene to correct the power supply potential, or to adjust the clock speed or signal timing to permit correct operation despite the sub-tolerance power supply voltage.

As in the first embodiment, the operational amplifiers 20, 21, 22 are able to detect the power supply potentials in their own functional blocks accurately, without being disturbed by electrical noise from other blocks, and the output signals of the operational amplifiers are bi-level signals that are transmitted to the external terminals AOUT_A, AOUT_B, AOUT_C reliably despite the presence of such noise. The semiconductor integrated circuit accordingly operates correctly even when the power supply potential drops in one or more of its functional blocks.

A further advantage of the second embodiment is that when a functional block is inactive, the operational amplifier provided in that functional block is disabled and does not consume power.

In a variation of the second embodiment, the positions of NMOS transistor 226 and NMOS transistor 229 in FIG. 6 are interchanged.

The invention is not limited to the operational amplifiers shown in FIGS. 3 and 6, or to use of the functional blocks illustrated in FIGS. 7 to 9. Other types of voltage drop detection circuits and functional blocks may be employed.

Those skilled in the art will recognize that further variations are possible within the scope of the invention, which is defined in the appended claims.

What is claimed is:

1. A semiconductor integrated circuit comprising:
   at least one functional block having a voltage drop detection circuit for detection a power supply voltage drop within the functional block and outputting a signal indicating whether or not the voltage drop is present, the voltage drop detection circuit being disposed within the functional block, wherein the voltage drop detection circuit compares the power supply voltage at a measurement point within the functional block with a reference voltage, and the voltage drop detection circuit includes an operational amplifier; and
   wherein the operational amplifier includes a first p-channel metal-oxide-semiconductor (PMOS) transistor having a source, a gate, and a drain, the source receiving the power supply voltage;
   a second PMOS transistor having a source, a gate, and a drain, the source receiving the power supply voltage;
   a first n-channel metal-oxide-semiconductor (NMOS) transistor having a source, a gate receiving the reference voltage, and a drain connected to the drain of the first PMOS transistor;
   a second NMOS transistor having a source, a gate receiving the power supply voltage to be measured, and a drain connected to the gates of the first and second PMOS transistors and the drain of the second PMOS transistor; and
   a third NMOS transistor having a source connected to ground, a gate receiving a gain adjustment signal, and a drain connected to the sources of the first and second NMOS transistors;
   the signal indicating whether or not the voltage drop is present being output from the drains of the first PMOS transistor and the first NMOS transistor.

2. A semiconductor integrated circuit comprising at least one functional block having a voltage drop detection circuit for detection a power supply voltage drop within the functional block and outputting a signal indicating whether or not the voltage drop is present, the voltage drop detection circuit being disposed within the functional block, wherein the operational amplifier includes a first PMOS transistor having a source, a gate, and a drain, the source receiving the power supply voltage;

a second PMOS transistor having a source, a gate and a drain, the source receiving the power supply voltage;

a third PMOS transistor having a source receiving the power supply voltage, a gate receiving an enable signal that goes high when the functional block including the operational amplifier is active and low when the functional block including the operational amplifier is inactive, and a drain connected to the drain of the first PMOS transistor;

a first NMOS transistor having a source, a gate receiving the reference voltage, and a drain connected to the drain of the first PMOS transistor;

a second NMOS transistor having a source, a gate receiving the power supply voltage to be measured, and a drain connected to the gates of the first and second PMOS transistors and the drain of the second PMOS transistor;

a third NMOS transistor having a source, a gate receiving a gain adjustment signal, and a drain connected to the sources of the first and second NMOS transistors; and a fourth NMOS transistor having a source connected to ground, a gate receiving the enable signal, and a drain connected to the source of the third NMOS transistor;

the signal indicating whether or not the voltage drop is present being output from the drains of the first PMOS transistor, the first NMOS transistor, and the third PMOS transistor;

wherein the voltage drop detection circuit, and the functional block in which the voltage drop detection circuit is disposed, have respective active and inactive states, and the voltage drop detection circuit operates in its active state only when the functional block in which the voltage drop detection circuit is disposed is active; and wherein the voltage drop detection circuit in each functional block includes an operational amplifier.

3. The semiconductor integrated circuit of claim 2, wherein at least one of the functional blocks is a register bank circuit having a plurality of interconnected registers receiving a common clock signal.

4. The semiconductor integrated circuit of claim 2, wherein at least one of the functional blocks comprises a plurality of adders, each adder receiving a carry bit and two addend bits and outputting a carry bit and a sum bit, the adders being interconnected in a series having a first adder and a last adder, each adder in the series except the first adder receiving said carry bit from a preceding adder in the series.

5. The semiconductor integrated circuit of claim 2, wherein at least one of the functional blocks is a bit shifter that shifts data left or right by a designated number of bits.

* * * * *